United States Patent
Lee et al.

(10) Patent No.: US 9,608,046 B2
(45) Date of Patent: Mar. 28, 2017

(54) ORGANIC LIGHT EMITTING DIODE DISPLAY HAVING QUANTUM DOT

(71) Applicant: LG DISPLAY CO., LTD., Seoul (KR)

(72) Inventors: Choonghoon Lee, Paju-si (KR); Sungjin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/980,975

(22) Filed: Dec. 28, 2015

(65) Prior Publication Data
US 2016/0190497 A1 Jun. 30, 2016

(30) Foreign Application Priority Data
Dec. 29, 2014 (KR) .................. 10-2014-0191935

(51) Int. Cl.
| | |
|---|---|
| H01L 27/00 | (2006.01) |
| H01L 51/00 | (2006.01) |
| H01L 27/32 | (2006.01) |
| H01L 51/50 | (2006.01) |

(52) U.S. Cl.
CPC ........ *H01L 27/322* (2013.01); *H01L 51/5012* (2013.01)

(58) Field of Classification Search
CPC ............. H01L 27/3248; H01L 27/3209; H01L 27/1214; H01L 51/502; H01L 51/5253; H01L 51/5284; H01L 51/504
See application file for complete search history.

(56) References Cited

U.S. PATENT DOCUMENTS

| | | | | |
|---|---|---|---|---|
| 7,791,271 B2* | 9/2010 | Cok | ....................... | H01L 27/322 313/506 |
| 2007/0200492 A1* | 8/2007 | Cok | ....................... | H01L 27/322 313/506 |
| 2011/0043102 A1* | 2/2011 | Lee | ....................... | C09K 11/06 313/504 |
| 2015/0228697 A1* | 8/2015 | Liu | ....................... | H01L 27/322 257/40 |
| 2016/0028035 A1* | 1/2016 | Yang | ..................... | H01L 51/502 257/40 |

OTHER PUBLICATIONS

McElvain et al, "Formation and growth black spots in organic light-emitting diodes", 1996, J. Applied Physics, vol. 80 No. 10 pp. 6002-6007, published Nov. 15, 1996.*

* cited by examiner

*Primary Examiner* — Nikolay Yushin
(74) *Attorney, Agent, or Firm* — Birch, Stewart, Kolasch & Birch, LLP

(57) ABSTRACT

The present disclosure relates to an organic light emitting diode display having a quantum dot. The present disclosure suggests an organic light emitting diode display including a substrate having a plurality of pixel area, each pixel area having a light emitting area and a non-light emitting area; a thin film transistor disposed in the non-light emitting area; an organic light emitting diode including an anode electrode, a cathode electrode and a source energy layer between the anode electrode and the cathode electrode, connected to the thin film transistor, and disposed in the light emitting area; an encapsulation layer joined on the substrate; and a quantum light emitting layer radiating lights having any one wavelength by an energy from the source energy layer, and disposed on an inner surface of the encapsulation layer as corresponding to the source energy layer.

7 Claims, 6 Drawing Sheets

US 9,608,046 B2

ORGANIC LIGHT EMITTING DIODE DISPLAY HAVING QUANTUM DOT

CROSS-REFERENCE TO RELATED APPLICATION

This application claims the priority benefit of Korea Patent Application No. 10-2014-0191935 filed on Dec. 29, 2014, which is incorporated herein by reference for all purposes as if fully set forth herein.

BACKGROUND OF THE INVENTION

Field of the Invention

The present disclosure relates to an organic light emitting diode display having a quantum dot. Particularly, the present disclosure relates to an organic light emitting diode display having a source energy layer which generates a high energy relating to the ultra violet wavelength range and has high light absorbing ability, and a quantum dot which receives the high energy from the source energy layer and generating lights having the visible light wavelength.

Discussion of the Related Art

Nowadays, various flat panel display devices are developed for overcoming many drawbacks of the cathode ray tube such as heavy weight and bulk volume. The flat panel display devices include a liquid crystal display device (or LCD device), a field emission display (or FED), a plasma display panel (or PDP) and an electroluminescence device (or EL). Specifically, the low temperature poly silicon is used for the active layer of the thin film transistor to get better quality of the flat panel displays.

The electroluminescence display device is categorized into an inorganic light emitting diode display device and an organic light emitting diode display device according to the luminescence material. As a self-emitting display device, the electroluminescence display device has merits in that the response speed is very fast, the brightness is very high and the view angle is large. The organic light emitting diode display has better energy efficiency and lower current leakage and is easier to represent the gray/color scale by current control.

FIG. 1 is a diagram illustrating the structure of the organic light emitting diode according to the related art. As shown in FIG. 1, the organic light emitting diode comprises an organic light emitting material layer and a cathode and the anode which are facing each other with an organic light emitting material layer therebetween. The organic light emitting material layer comprises a hole injection layer HIL, a hole transport layer HTL, an emission layer EML, an electron transport layer ETL and an electron injection layer EIL. The organic light emitting diode radiates the lights due to the energy from the exciton formed at the excitation state in which the hole and the electron are recombined at the emission layer EML.

The organic light emitting diode radiates the lights due to the energy from the exciton formed at the excitation state in which the hole from the anode and the electron from the cathode are recombined at the emission layer EML. The organic light emitting diode display can represent video data by controlling the amount (or 'brightness') of the light generated and radiated from the emission layer ELM of the organic light emitting diode as shown in FIG. 1.

The organic light emitting diode display (or OLED) using the organic light emitting diode can be categorized into a passive matrix type organic light emitting diode display (or PMOLED) and an active matrix type organic light emitting diode display (or AMOLED).

The active matrix type organic light emitting diode display (or AMOLED) shows the video data by controlling the current applying to the organic light emitting diode using the thin film transistor (or TFT).

FIG. 2 is the exemplary circuit diagram illustrating the structure of one pixel in the active matrix organic light emitting diode display (or AMOLED) according to the related art. FIG. 3 is a plane view illustrating the structure of the organic light emitting diode display using the thin film transistor according to the related art. FIG. 4 is a cross sectional view along the cutting line I-I' in FIG. 3 for illustrating the structure of the bottom emission type organic light emitting diode display according to the related art. FIG. 5 is a cross sectional view along the cutting line I-I' in FIG. 3 for illustrating the structure of the top emission type organic light emitting diode display according to the related art. As the differences between the bottom emission type and the top emission type are not shown in plane view, FIG. 3 is commonly used for these two emission types.

Referring to FIGS. 2 and 3, the active matrix organic light emitting diode display comprises a switching thin film transistor ST, a driving thin film transistor DT connected to the switching thin film transistor ST, and an organic light emitting diode OLED connected to the driving thin film transistor DT. By a scan line SL, a data line DL and a driving current line VDD disposed on a substrate SUB, a pixel area is defined. The organic light emitting diode OLED is formed in one pixel area and defines a light emitting area within the pixel area.

The switching thin film transistor ST is formed where the scan line SL and the data line DL are crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, the organic light emitting layer OL is disposed. The cathode electrode CAT is connected to the base voltage VSS. Between the gate electrode DG of the driving thin film transistor DT and the driving current line VDD or between the gate electrode DG of the driving thin film transistor DT and the drain electrode DD of the driving thin film transistor DT, a storage capacitance Cst is formed.

Referring to FIG. 4, the bottom emission type organic light emitting diode display according to the related art will be explained in detail. On the substrate SUB, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

The upper surface of the substrate having these thin film transistors ST and DT is not in even and/or smooth conditions, but in uneven and/or rugged conditions having many steps. In order that the organic light emitting diode display has good luminescent quality over the whole display area, the organic light emitting layer OL should be formed on an even or smooth surface. So, to make the upper surface in planar and even conditions, the over coat layer OC (or 'planar layer') is deposited on the whole surface of the substrate OC.

Then, on the over coat layer OC, the anode electrode ANO of the organic light emitting diode OLE is formed. Here, the anode electrode ANO is connected to the drain electrode DD of the driving thin film transistor DT through the contact hole penetrating the over coat layer OC and the passivation layer PAS.

On the substrate SUB having the anode electrode ANO, a bank BN is formed over the area having the switching thin film transistor ST, the driving thin film transistor DT and the various lines DL, SL and VDD, for defining the light emitting area. The exposed portion of the anode electrode ANO by the bank BN would be the light emitting area. On the anode electrode ANO exposed from the bank BN, the organic light emitting layer OL is formed. On the organic light emitting layer OL, the cathode electrode ACT is formed.

On the substrate SUB having the cathode electrode CAT, a spacer SP is disposed. The spacer SP is preferably formed on the bank BN, the non-aperture area. An encap substrate (or encapsulation substrate) ENC is joined with the lower substrate SUB with the spacer SP there-between. In order to join the encap substrate ENC and the lower substrate SUB, an adhesive layer or adhesive material may be further included between the encap substrate ENC and the lower substrate SUB.

For the case of the bottom emission type and full color organic light emitting diode display, the lights from the organic light emitting layer OL go out to the lower substrate SUB. Therefore, between the overcoat layer OC and the passivation layer PAS, a color filter CF may be further included, and the anode electrode ANO would be made of transparent conductive material. Further, it is preferable that the cathode electrode CAT includes metal material having high reflective property so that the lights from the organic light emitting layer OL can be reflected downward effectively. The organic light emitting layer OL may include an organic material generating white lights. The organic light emitting layer OL and the cathode electrode CAT may be disposed over the whole surface of the substrate SUB.

Hereinafter, referring to FIG. 5, the top emission type organic light emitting diode display for representing full color according to the related art will be explained. The basic structure of the top emission type is very similar with the bottom emission type. Therefore, the same explanation will not be duplicated. For the top emission type, the lights generated from the organic light emitting layer OL will go up to the encap substrate ENC attached on the lower substrate SUB. Therefore, it is preferable that the anode electrode ANO is made of a reflective metal material and the cathode electrode CAT is made of a transparent conductive material.

To represent/reproduce the full color, the organic light emitting layer OL may include an organic material which can emits any one color of red, green and blue. Otherwise, the organic light emitting layer OL may include an organic material which can emits the white color. In that case, the color filters CF may be disposed on the organic light emitting layer OL or cathode electrode CAT. Here, in convenience, the case where the color filter CF is disposed on the cathode electrode CAT is explained. The color filters CF may be disposed in a matrix manner in which a color filter set of red R, green G and blue B is alternatively arrayed.

For the bottom emission type, the user observes the display at the lower substrate SUB. On the contrary, for the top emission type, the user observes the display at the encap substrate ENC. Therefore, the ambient lights may be reflected by the outer surface of the lower substrate SUB or the encap substrate ENC, so that these reflected lights may hinder the seeing quality of the observer. Specially, in the case that the black matrix is disposed between each pixel areas, the ambient lights may be reflected by the black matrix.

To prevent the degradation of display quality be the reflected ambient lights, a polarization plate of λ/4 retardation may be attached on the surface seen by the observer. For example of the bottom emission type, a polarization film POL may be attached on the outer surface of the lower substrate SUB. For another example of the top emission type, a polarization film POL may be attached on the outer surface of the encap substrate ENC. However, attaching the polarization film POL, the transmittance ratio of the whole lights is lowered, so that the display quality may be degraded also. Further, for compensating the lowered brightness, more power consumption may be required.

In addition, in order to manufacture the full color organic light emitting diode display, it is required that the organic light emitting layer can be formed individually for representing any one of red, green and blue colors corresponding to each pixel area. However, by the currently used photolithography technology, it is very hard to pattern the organic light emitting material individually corresponding to each pixel area. So, for forming organic light emitting layer corresponding to each pixel area, it is preferable that the individual pixel area of the organic light emitting layer is formed by evaporating method using the screen mask.

For the case of the organic light emitting diode display having a 15 inch or less size, the organic light emitting layer OL may be selectively formed on the anode electrode ANO. For example, by a manufacturing process using a screen mask, the organic light emitting layer can be deposited at some specific area. However, for a large area organic light emitting diode display 20 inch to 100 inch size, it is very hard to deposit the organic light emitting layer on some specific area using the screen mask. The large area screen mask has very heavy weight so that it is hard to keep in perfectly plane condition. Therefore, it is hard to keep the evaporating distribution density in even condition on a large area surface. Thus a new technology or method for manufacturing a large area organic light emitting diode display is required.

SUMMARY OF THE INVENTION

In order to overcome the above mentioned drawbacks and other limitations associated with the related art, the present disclosure is to suggest an organic light emitting diode display having a large area and representing full color scale. Another purpose of the present disclosure is to suggest an organic light emitting diode display having excellent light emitting efficiency. Still another purpose of the present disclosure is to suggest an organic light emitting diode display preventing the reflection of the ambient lights and having higher brightness with lower energy consumption.

In order to accomplish the above purpose, the present disclosure suggests an organic light emitting diode display comprising: a substrate having a plurality of pixel area, each pixel area having a light emitting area and a non-light emitting area; a thin film transistor disposed in the non-light emitting area; an organic light emitting diode including an anode electrode, a cathode electrode and a source energy layer between the anode electrode and the cathode electrode, connected to the thin film transistor, and disposed in the light emitting area; an encap joined on the substrate; and a quantum light emitting layer radiating lights having any one wavelength by an energy from the source energy layer, and disposed on an inner surface of the encap as corresponding to the source energy layer.

In one embodiment, the source energy layer includes a black organic light emitting material configured to radiate an ultra violet light, and to absorb all visible lights.

In one embodiment, the quantum light emitting layer comprises any one of a red quantum light emitting layer, a green quantum light emitting layer and a blue quantum light emitting layer, the red quantum light emitting layer includes a first quantum dot configured to radiate red lights, the green quantum light emitting layer includes a second quantum dot configured to radiate green lights, and the blue quantum light emitting layer includes a third quantum dot configured to radiate blue lights.

In one embodiment, the anode electrode is disposed as being isolated according to the light emitting area of each pixel area, the source energy layer is stacked on the anode electrode in the light emitting area of each pixel area, and the cathode electrode is stacked on the source energy layer as covering the whole surface of the substrate.

In one embodiment, the organic light emitting diode display further comprises: a hole injection layer stacked on the whole area of the substrate between the anode electrode and the source energy layer; a hole transport layer stacked on the whole area of the substrate between the hole injection layer and the source energy layer; an electron transport layer stacked on the whole area of the substrate between the source energy layer and the cathode electrode; and an electron injection layer stacked on the whole area of the substrate between the electron transport layer and the cathode electrode.

Furthermore, the present disclosure suggests an organic light emitting diode display comprising: a plurality of pixel areas disposed in a matrix manner on a substrate; an organic ultra violet light emitting diode disposed at each of the pixel areas; an encap attached on the substrate; and a quantum light emitting layer disposed as corresponding to the organic ultra violet light emitting diode between the encap and the substrate.

In one embodiment, the organic ultra violet light emitting diode includes: an anode electrode disposed at each of the pixel areas; an organic ultra violet light emitting layer disposed on the anode electrode at each of the pixel areas; and a cathode electrode stacked on the organic ultra violet light emitting layer as covering the whole area of the substrate.

In one embodiment, the organic ultra violet light emitting layer includes a black organic light emitting material configured to radiate an ultra violet light, and to absorb all visible lights.

In one embodiment, the quantum light emitting layer comprises any one of a red quantum light emitting layer, a green quantum light emitting layer and a blue quantum light emitting layer, the red quantum light emitting layer includes a first quantum dot configured to radiate red lights, the green quantum light emitting layer includes a second quantum dot configured to radiate green lights, and the blue quantum light emitting layer includes a third quantum dot configured to radiate blue lights.

The organic light emitting diode display according to the present disclosure includes a source energy layer having a black resin material configured to generate the ultra violet lights and to absorb the visible lights, and the quantum dots radiating red, green and blue lights by the ultra violet lights from the source energy layer. As providing the high efficiency light energy, the organic light emitting diode can have a higher photo energy efficiency within smaller size of the pixel area. By forming just one layer of the source energy layer between anode electrode and the cathode electrode, the organic light emitting diode display can be manufactured using just one screen mask process. Therefore, for manufacturing the large area organic light emitting diode display, excellent quality can be ensured and cost can be saved. As the source energy layer is made of a black resin material for absorbing the visible lights, the visible light entering into the display is not reflected to the observer. There is no optical sheet such as polarization sheet for reducing the reflective lights, so that higher brightness can be ensured with the same energy consumption.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Figure 1:
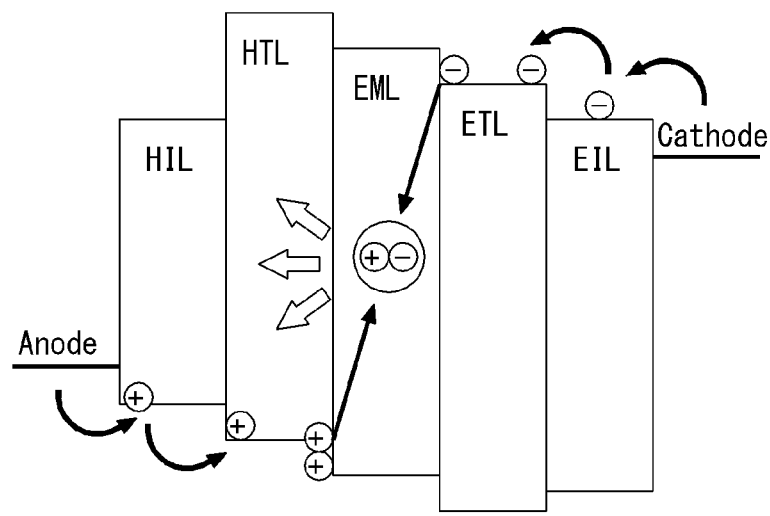
FIG. 1 is a diagram illustrating the structure of the organic light emitting diode according to the related art.
Figure 2:
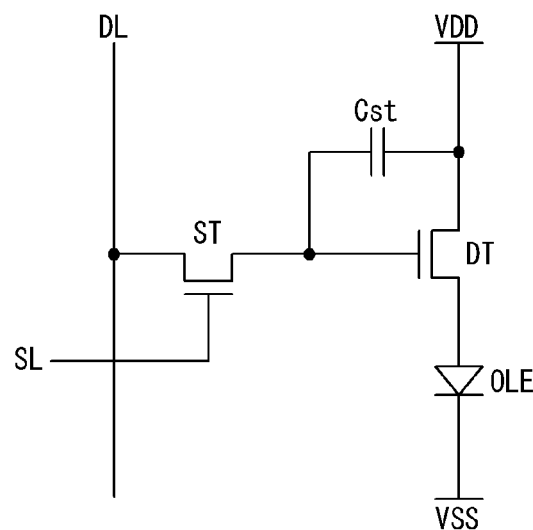
FIG. 2 is the exemplary circuit diagram illustrating the structure of one pixel in the active matrix organic light emitting diode display (or AMOLED) according to the related art.
Figure 3:
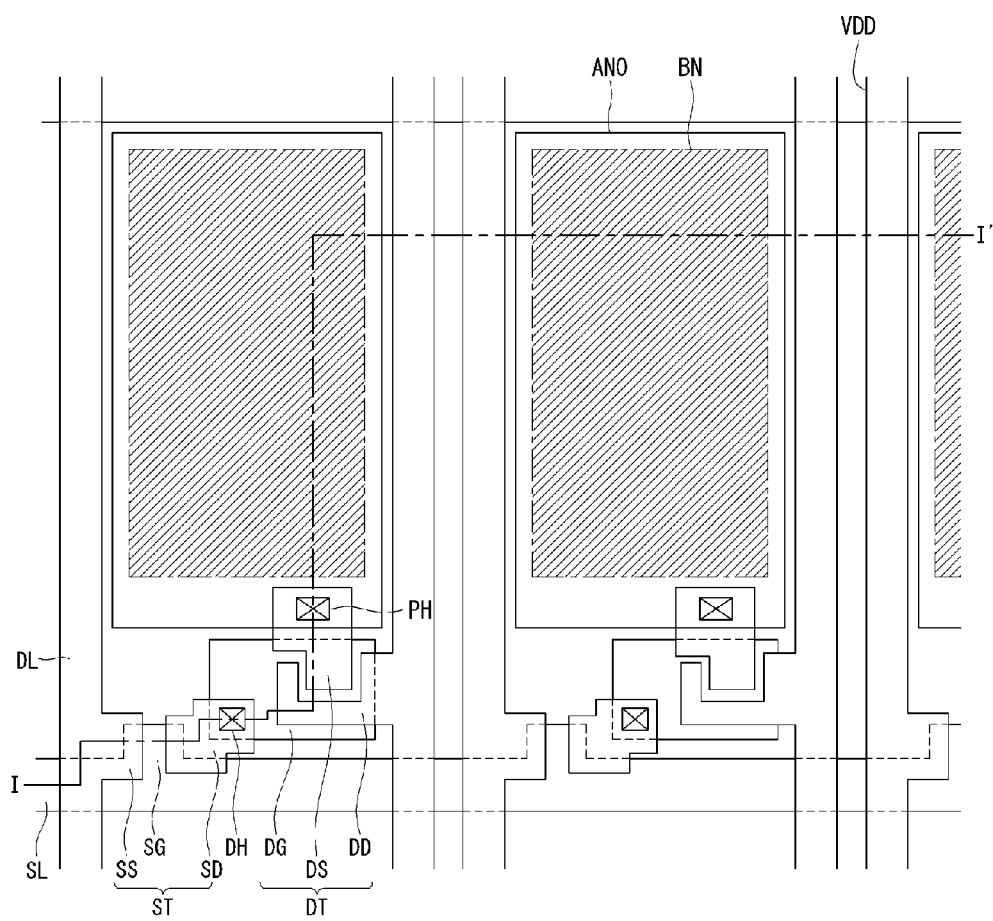
FIG. 3 is a plane view illustrating the structure of the organic light emitting diode display using the thin film transistor according to the related art.

Referring to attached figures, preferred embodiments of the present disclosure will be explained below. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 6:
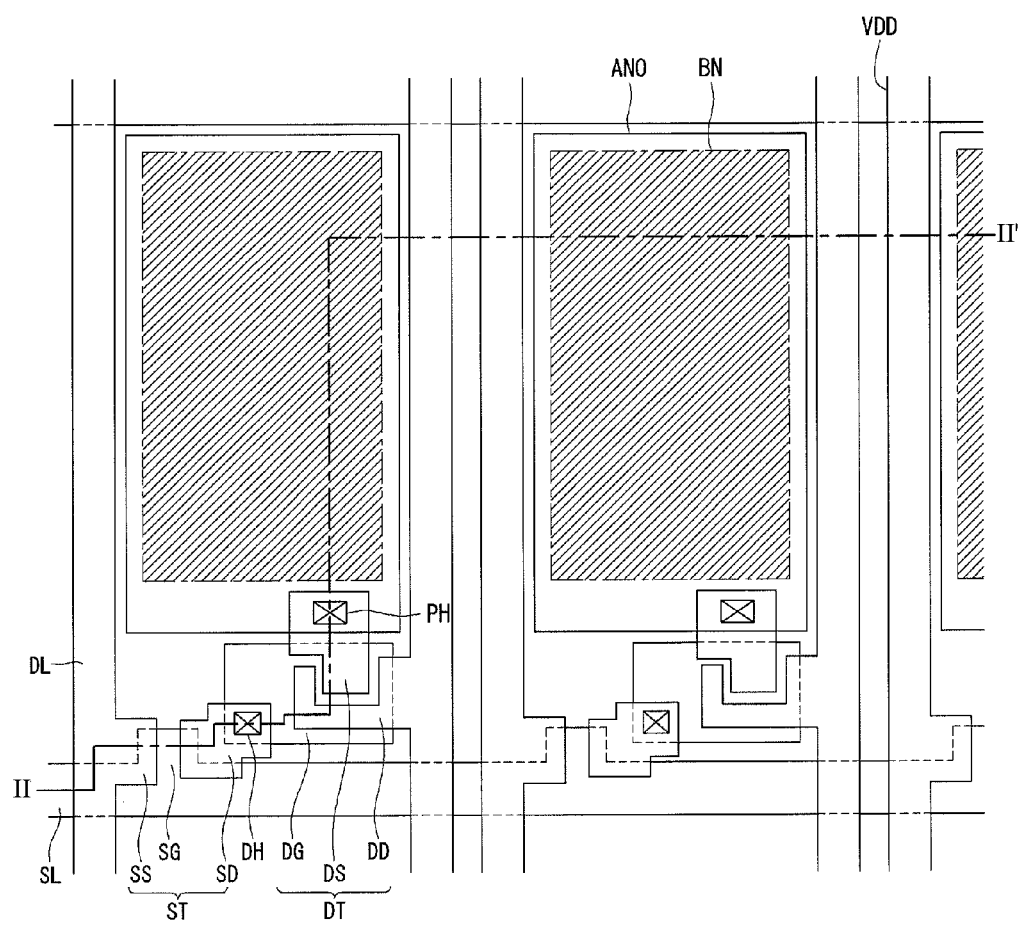
FIG. 6 is a plane view illustrating the structure of an organic light emitting diode display having a quantum dot according to an embodiment of the present disclosure.
Figure 7:
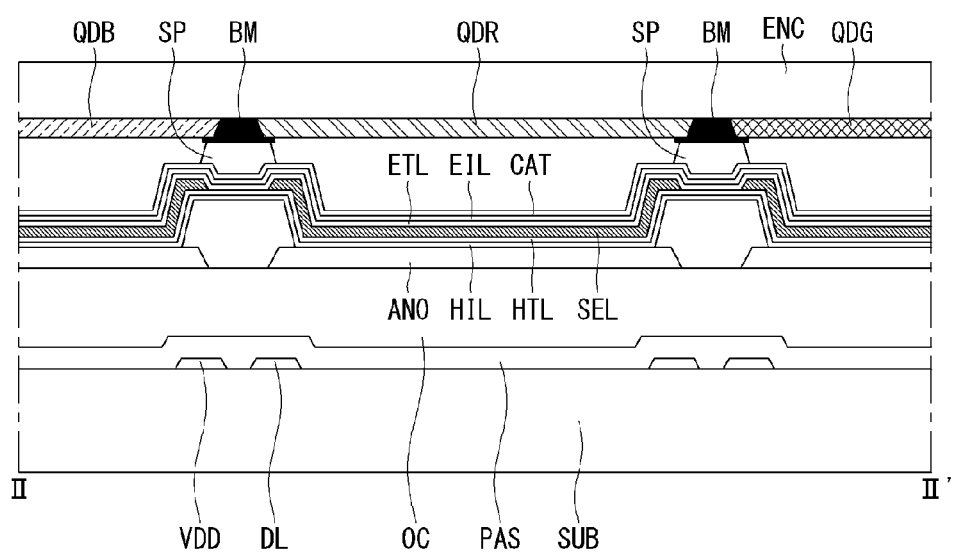
FIG. 7 is a cross sectional view along the cutting line of II-IF in FIG. 6 for illustrating the structure of an organic light emitting diode display having a quantum dot according to a first embodiment of the present disclosure.

Hereinafter, referring to FIGS. 6 and 7, an organic light emitting diode display having a quantum dot will be explained according to an embodiment of the present disclosure. FIG. 6 is a plane view illustrating the structure of an organic light emitting diode display having a quantum dot according to the embodiment of the present disclosure. FIG. 7 is a cross sectional view along the cutting line of II-IF in FIG. 6 for illustrating the structure of an organic light emitting diode display having a quantum dot according to a first embodiment of the present disclosure. All the components of the organic light emitting diode display according to all embodiments of the present disclosure are operatively coupled and configured.

Figure 5:
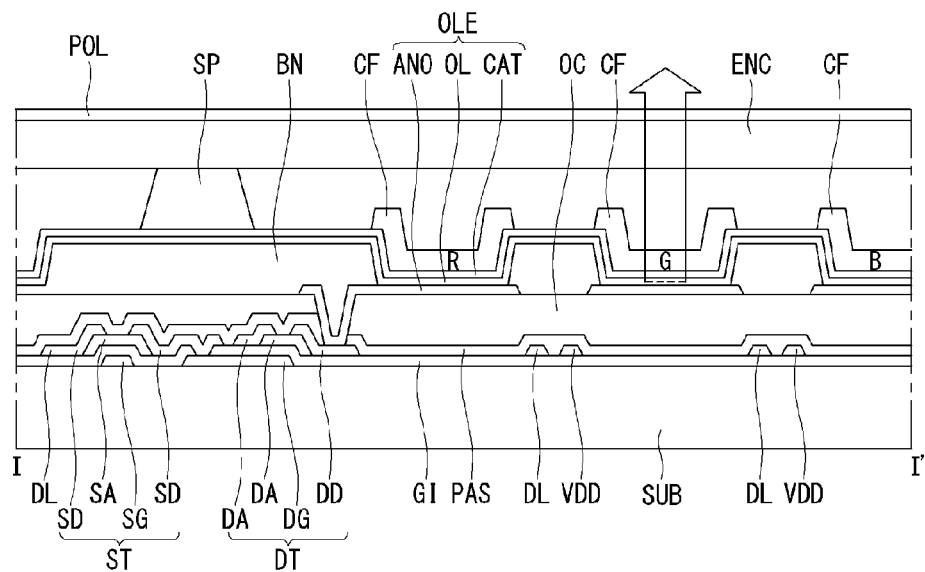
FIG. 5 is a cross sectional view along the cutting line I-I' of FIG. 3 for illustrating the structure of the top emission type organic light emitting diode display according to the related art.

Referring to FIGS. 5 and 6, an organic light emitting diode display having a quantum dot according to the embodiment of the present disclosure has a switching thin film transistor ST and a driving thin film transistor DT connected to the switching thin film transistor ST, and an organic light emitting diode OLE connected to the driving thin film transistor DT. A plurality of scan line SL, a plurality of data line DL and a plurality of driving current line VDD are disposed on a substrate SUB to form a plurality of pixel area. As forming the organic light emitting diode OLE is formed within the pixel area, the light emitting area is defined.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, the organic light emitting layer OL is disposed. The cathode electrode CAT is connected to the base voltage VSS. Between the gate electrode DG of the driving thin film transistor DT and the driving current line VDD or between the gate electrode DG of the driving thin film transistor DT and the drain electrode DD of the driving thin film transistor DT, a storage capacitance Cst is formed.

Figure 4:
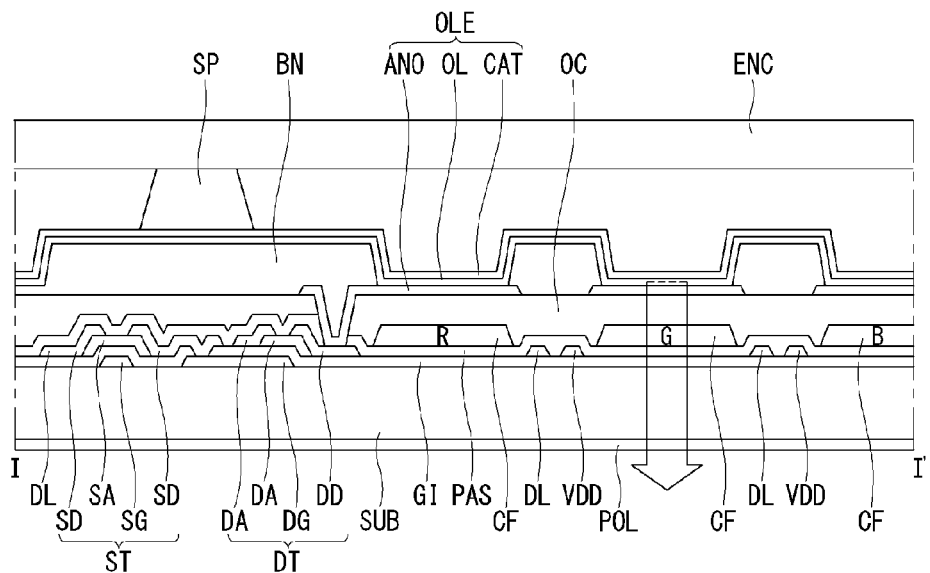
FIG. 4 is a cross sectional view along the cutting line I-I' of FIG. 3 for illustrating the structure of the bottom emission type organic light emitting diode display according to the related art.

For detail explanation, FIG. 7 will be discussed. In the present disclosure, the thin film transistors ST and DT may have similar structures with the related art. However, one of the main features of the present disclosure are an organic light emitting diode OLE and an encap (or encapsulation layer/substrate) ENC. Therefore, the main features of the present disclosure will be explained using FIG. 7 illustrating the cross sectional structure of the organic light emitting diode. For the structure of the basic thin film transistors will be explained using FIG. 4.

On a large area substrate SUB over 20 inch of diagonal length, the gate electrodes SG and DG of the switching thin film transistor ST and the driving thin film transistor DT, respectively are formed. The organic light emitting diode display according to this embodiment the present disclosure is one of a top emission type. Therefore, the substrate SUB may not be a transparent substrate. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

The upper surface of the substrate having these thin film transistors ST and DT is not in even and/or smooth conditions, but in uneven and/or rugged conditions having many steps. In order that the organic light emitting diode display has good luminescent quality over the whole display area, the organic light emitting layer OL should be formed on an even or smooth surface. So, to make the upper surface in planar and even conditions, the over coat layer OC (or 'planar layer') is deposited on the whole surface of the substrate OC.

On the over coat layer OC, the anode electrode ANO of the organic light emitting diode OLE is formed. It is preferable that the anode electrode ANO is formed as one anode electrode ANO is disposed at one of pixel areas disposed in a matrix manner. Further, the anode electrode ANO is connected to the drain electrode DD of the driving thin film transistor DT through the contact hole penetrating the over coat layer OC and the passivation layer PAS.

On the substrate SUB having the anode electrode ANO, a bank BN is formed over the area having the switching thin film transistor ST, the driving thin film transistor DT and the various lines DL, SL and VDD, for defining the light emitting area. The exposed portion of the anode electrode ANO by the bank BN would be the light emitting area.

On the anode electrode ANO exposed from the bank BN, a hole injection layer HIL is deposited. On the hole injection layer HIL, a hole transport layer HTL is stacked. It is preferable that the hole injection layer HIL and the hole transport layer HTL are disposed as filling and covering all pixel areas. That is, the hole injection layer HIL and the hole transport layer HTL may be disposed as the thin layers as covering the whole surface of the substrate SUB.

On the hole transport layer HTL, a source energy layer SEL is stacked. Specifically, the source energy layer SEL may have the same shape with the anode electrode ANO. That is, it is preferable that the source energy layer SEL is formed as one source energy layer SEL is disposed at each pixel area. Further, it is preferable that the source energy layer SEL includes an organic material which radiates the ultra violet lights having any one wavelength between the 300 nm to 350 nm wavelength ranges. In addition, it is preferable that the source energy layer SEL includes an organic material which absorbs the visible lights having 380 nm to 780 nm wavelength ranges. For example, the source energy layer SEL may be a black organic ultra violet light emitting layer which radiates an ultra violet light having high energy, and has high absorption index to the visible lights.

Figure 8:
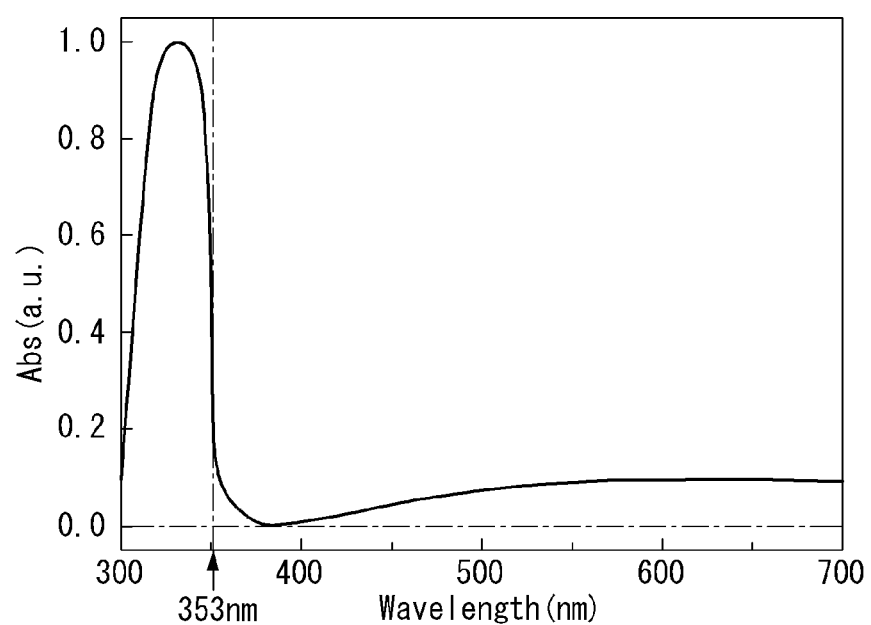
FIG. 8 is a graph illustrating an example of the wavelength rages of the source energy provided from a source energy layer of the organic light emitting diode display having a quantum dot according to a second embodiment of the present disclosure.

FIG. 8 shows examples of the wavelength ranges of the ultra violet lights which are radiated from the source energy layer SEL included in the organic light emitting diode display according to an embodiment of the present disclosure. FIG. 8 is a graph illustrating the wavelength rages of the source energy provided from a source energy layer of the organic light emitting diode display having a quantum dot according to the second embodiment of the present disclosure.

On the source energy layer SEL, an electron transport layer ETL is disposed. On the electron transport layer ETL, an electron injection layer EIL is stacked. On the electron injection layer EIL, a cathode electrode CAT is deposited. It is preferable that the electron transport layer ETL, the electron injection layer EIL and the cathode electrode CAT are covering all pixel areas. Therefore, they may have the thin film structure in which they are sequentially stacked as covering the whole surface of the display area on the substrate SUB. Consequently, an organic ultra violet light emitting diode OLE including the anode electrode ANO, the source energy layer SEL and the cathode electrode CAT is completed.

On the substrate SUB having the thin film transistors ST and DT and the organic ultra violet light emitting diode OLE, an encap ENC (e.g., encapsulation layer/substrate) is attached. It is preferable that the encap ENC is attached on the substrate SUB with a uniform gap. In order to keep the uniform gap between the substrate SUB and the encap ENC, a plurality of spacers SP may be formed on the substrate SUB. It is preferable that the spacer SP is disposed on the bank BN covering the non-display area including the driving current line VDD, the scan line SL and/or the data line DL.

On the inner surface of the encap ENC, a plurality of quantum emitting layers QDR, QDG and QDB including quantum dots are disposed. Any one of the quantum emitting layers QDR, QDG and QDB is disposed at any one of the pixel areas arrayed in a matrix manner as corresponding to the anode electrode ANO and/or the source energy layer SEL.

The quantum emitting layers QDR, QDG and QDB include the quantum dots. The quantum dot is a semiconductor particle having, e.g., a diameter of 2~12 nm. According to the size of the particle, it emits lights having a certain wavelength. As radiating the ultra violet lights, the quantum dot emits any one light of red light, green light and blue light according to the size of the quantum dot. For example, at the red quantum emitting layers QDR, a plurality of red quantum dots are disposed which generate the red lights as receiving the ultra violet lights from the source energy layer SEL. At the green quantum emitting layers QDG, a plurality of green quantum dots are disposed which generate the green lights as receiving the ultra violet lights from the source energy layer SEL. At the blue quantum emitting layers QDB, a plurality of blue quantum dots are disposed which generate the blue lights as receiving the ultra violet lights from the source energy layer SEL.

Between each of the quantum emitting layers QDR, QDG and QDB, a black matrix BM may be disposed. The black matrix BM is for preventing the lights from each pixel area being mixed each other, so that the purity of the color lights can be ensured. For the case that the black matrix BM is included, the spacer SP for keeping the cell gap between the substrate SUB and the encap ENC may be disposed as overlapping with the black matrix BM.

In the organic light emitting diode display having the quantum dots, the source energy layer SEL is formed as having the isolated shape in each pixel area with just one evaporating process using a screen mask. Further, the full color scale is presented by the quantum emitting layers QDR, QDG and QDB. After forming the quantum organic materials on the inner surface of the encap ENC, the encap ENC is joined with the substrate SUB. Therefore, the processes for manufacturing the substrate SUB having the thin film transistors ST and DT and the organic light emitting diode OLE can be simplified, and the manufacturing cost can be saved.

In the organic light emitting diode display having the quantum dots according to the embodiments of the present disclosure, the source energy layer SEL radiating the ultra violet lights is inserted between the anode electrode ANO and the cathode electrode CAT. The source energy layer SEL includes a black resin material having a good absorption index/ratio. That is, the source energy layer SEL radiates the ultra violet lights, but it absorbs most of all visible lights entering from outside. Therefore, any ambient lights entering from outside are absorbed by the source energy layer SEL before reflecting by the anode electrode ANO or the cathode electrode CAT. Consequently, the organic light emitting diode display having the quantum dots according to the present disclosure can suggest better display quality by eliminating the reflection of the ambient light.

Furthermore, as the source energy layer SEL has the organic material radiating the ultra violet lights having high energy, higher energy can be provided to the quantum light emitting layer, with the same energy consumption. Therefore, the present disclosure can suggest the organic light emitting diode display having enhanced energy efficiency, higher photo efficiency and improved brightness.

The organic light emitting diode display having the quantum dots according to the present disclosure does not require any optical element to reduce the reflection of the ambient lights, such as the polarization plate. As there is no degradation of brightness by the polarization plate, it can provide higher brightness with the same power consumption.

In the above mentioned embodiments, the organic light emitting diode display has a red pixel, a green pixel and a blue pixel for representing the full color scale. In that case, the unit pixel area includes three sub pixel areas having a red sub pixel area, a green sub pixel area and a blue sub pixel area. In other cases, in order to increase the color purity, more sub pixels for other colors may be included. For example, the unit pixel area may include four or six sub pixel areas adding to the red, the green and the blue sub pixels.

While the embodiments of the present invention have been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. An organic light emitting diode display device comprising:
   a substrate having a plurality of pixel area, each pixel area having a light emitting area and a non-light emitting area;
   a thin film transistor disposed in the non-light emitting area;
   an organic light emitting diode including an anode electrode, a cathode electrode and a source energy layer between the anode electrode and the cathode electrode, connected to the thin film transistor, and disposed in the light emitting area;
   an encapsulation layer joined on the substrate; and
   a quantum light emitting layer radiating lights having any one wavelength by an energy from the source energy layer, and disposed on an inner surface of the encapsulation layer as corresponding to the source energy layer,
   wherein the source energy layer includes:
      a first organic material radiating an ultra violet light having a wavelength in a range from 300 nm to 350 nm, and
      a second organic material absorbing visible lights having a wavelength in a range from 380 nm to 780 nm.

2. The organic light emitting diode display device according to claim 1, wherein the quantum light emitting layer comprises any one of a red quantum light emitting layer, a green quantum light emitting layer and a blue quantum light emitting layer,
   the red quantum light emitting layer includes a first quantum dot configured to radiate red lights,
   the green quantum light emitting layer includes a second quantum dot configured to radiate green lights, and
   the blue quantum light emitting layer includes a third quantum dot configured to radiate blue lights.

3. The organic light emitting diode display device according to claim 1, wherein the anode electrode is disposed as being isolated according to the light emitting area of each pixel area,
   the source energy layer is stacked on the anode electrode in the light emitting area of each pixel area, and
   the cathode electrode is stacked on the source energy layer as covering the entire surface of the substrate.

4. The organic light emitting diode display device according to claim 1, further comprising:
   a hole injection layer stacked on the entire area of the substrate between the anode electrode and the source energy layer;
   a hole transport layer stacked on the entire area of the substrate between the hole injection layer and the source energy layer;
   an electron transport layer stacked on the entire area of the substrate between the source energy layer and the cathode electrode; and
   an electron injection layer stacked on the entire area of the substrate between the electron transport layer and the cathode electrode.

5. An organic light emitting diode display comprising:
   a plurality of pixel areas disposed in a matrix manner on a substrate;
   an organic ultra violet light emitting diode disposed at each of the pixel areas;
   an encapsulation layer attached on the substrate; and
   a quantum light emitting layer disposed as corresponding to the organic ultra violet light emitting diode between the encapsulation layer and the substrate,
   wherein the organic ultra violet light emitting diode includes:
      a first organic material radiating an ultra violet light having a wavelength in a range from 300 nm to 350 nm, and
      a second organic material absorbing visible lights having a wavelength in a range from 380 nm to 780 nm.

6. The organic light emitting diode display according to claim 5, wherein the organic ultra violet light emitting diode includes:
   an anode electrode disposed at each of the pixel areas;
   an organic ultra violet light emitting layer disposed on the anode electrode at each of the pixel areas; and
   a cathode electrode stacked on the organic ultra violet light emitting layer as covering the entire area of the substrate, and
   wherein the organic ultra violet light emitting layer includes the first organic material and the second organic material.

7. The organic light emitting diode display according to claim 5, wherein the quantum light emitting layer comprises any one of a red quantum light emitting layer, a green quantum light emitting layer and a blue quantum light emitting layer,
   the red quantum light emitting layer includes a first quantum dot configured to radiate red lights,
   the green quantum light emitting layer includes a second quantum dot configured to radiate green lights, and
   the blue quantum light emitting layer includes a third quantum dot configured to radiate blue lights.

* * * * *